(12) United States Patent
Demiryont

(10) Patent No.: US 9,761,830 B1
(45) Date of Patent: Sep. 12, 2017

(54) ENVIRONMENTAL PROTECTION FILM FOR THIN FILM DEVICES

(71) Applicant: Eclipse Energy Systems, Inc., St. Petersburg, FL (US)

(72) Inventor: Hulya Demiryont, Indian Rocks Beach, FL (US)

(73) Assignee: Eclipse Energy Systems, Inc., St. Petersburg, FL (US)

(*) Notice: Subject to any disclaimer, the term of this patent is extended or adjusted under 35 U.S.C. 154(b) by 80 days.

(21) Appl. No.: 14/582,563

(22) Filed: Dec. 24, 2014

Related U.S. Application Data

(63) Continuation-in-part of application No. 13/470,506, filed on May 14, 2012, now abandoned.

(51) Int. Cl.
| | |
|---|---|
| B32B 9/04 | (2006.01) |
| C23C 28/00 | (2006.01) |
| H01L 31/0216 | (2014.01) |
| H01L 31/0264 | (2006.01) |
| H01L 51/52 | (2006.01) |
| H01L 51/56 | (2006.01) |

(52) U.S. Cl.
CPC ...... H01L 51/5253 (2013.01); H01L 51/5271 (2013.01); H01L 51/56 (2013.01)

(58) Field of Classification Search
None
See application file for complete search history.

(56) References Cited

U.S. PATENT DOCUMENTS

| | | | |
|---|---|---|---|
| 3,807,832 A | 4/1974 | Castellion | |
| 4,637,976 A * | 1/1987 | Terao et al. | 430/523 |
| 4,892,790 A * | 1/1990 | Gray | 428/548 |
| 5,116,674 A | 5/1992 | Schmidhalter et al. | |
| 5,757,126 A | 5/1998 | Harvey, III et al. | |
| 2002/0177268 A1* | 11/2002 | Lu et al. | 438/200 |
| 2003/0013265 A1* | 1/2003 | Yang et al. | 438/398 |
| 2003/0127973 A1* | 7/2003 | Weaver et al. | 313/504 |
| 2004/0053064 A1 | 3/2004 | Masuda et al. | |
| 2006/0066803 A1 | 3/2006 | Aylward et al. | |
| 2006/0158101 A1* | 7/2006 | Camilletti | H01L 51/0097 313/504 |
| 2008/0057260 A1* | 3/2008 | Buchhauser et al. | 428/76 |
| 2009/0087998 A1* | 4/2009 | Kharrazi-Olsson | H01L 51/0097 438/761 |
| 2009/0109537 A1* | 4/2009 | Bright | G02B 5/287 359/588 |
| 2010/0012621 A1* | 1/2010 | Gustafsson et al. | 216/13 |
| 2011/0151173 A1* | 6/2011 | Ramadas et al. | 428/76 |
| 2012/0228641 A1* | 9/2012 | Thoumazet et al. | 257/79 |

FOREIGN PATENT DOCUMENTS

JP      11120619 A  *  4/1999  ............... G11B 7/24

* cited by examiner

*Primary Examiner* — Lisha Jiang
(74) *Attorney, Agent, or Firm* — Christopher & Weisberg, P.A.

(57) ABSTRACT

A protective film for a thin film device comprises a composite inorganic film that may be deposited on a parylene film or deposited directly on the device. Optionally, additional parylene and composite inorganic protective films may be added. The composite inorganic protective film is on the order of 1-100 nm thick and contains a material (e.g., Si) that forms a tenacious oxide at room temperature. When the device is exposed to air after deposition of the composite inorganic film, the oxidizable species oxidizes and fills voids to create an effective diffusion barrier.

12 Claims, 3 Drawing Sheets

ENVIRONMENTAL PROTECTION FILM FOR THIN FILM DEVICES

CROSS-REFERENCE TO RELATED APPLICATION

This application is a continuation-in-part-of patent application Ser. No. 13/470,506, filed May 14, 2012, entitled ENVIRONMENTAL PROTECTION FILM FOR THIN FILM DEVICES, the entirety of which is incorporated herein by reference.

STATEMENT REGARDING FEDERALLY SPONSORED RESEARCH OR DEVELOPMENT n/a

FIELD OF THE INVENTION

This invention relates to fabrication of thin composite inorganic protective films and more specifically to such films that can serve as environmentally protective layers needed by many thin film electronic devices, such as electrochromic and optoelectronic devices.

BACKGROUND OF THE INVENTION

A long-standing problem that electrochromic and optoelectronic devices share with other thin film device structures is that of environmental degradation. Attempts to eliminate this problem by encapsulating or coating such devices have generally proven unsuccessful.

One existing process for creating a barrier coating involves using an energetic sputtering processing to create a graded barrier film. In particular, the sputtering process is based on the use of oxygen and nitrogen reactive ions in an alternating sequence to create a graded barrier file including metal oxide layers and a metal nitride layer. For example, a metal target is bombarded by energetic argon and reactive gas plasma in a vacuum environment and sputtered material is deposited on a substrate. The coating deposited on the substrate is no longer metal but a metal oxide or metal nitride. Metal oxides are preferred to metals for use with some thin film devices because metal oxides like $AL_2O_3$ or AlN are transparent while metals are too opaque for light transmittance as required by some thin film devices.

However, the sputtering process creates films that have internal stress. The thicker the film, the higher the stress. Reactive sputtering from an Al target results in dense $Al_2O_3$ layers that act as the barrier functioning layers and an AlN layer that acts as the stress release layer. In other words, this existing process relies on a sputtering process to create a thicker metal nitride layer to support metal oxide layers, thereby reducing inherent cracks in the metal oxide layers.

However sputtering is an energetic deposition process that generates heat on the substrate surface such that it is not appropriate to deposit a film on plastic substrates. The high energetic nature of the sputtering forms high packing density rigid films that easily crack on flexible substrates. In this process, solid target material is bombarded with high energetic gas plasma to create sputtered particles from the target. These particles react with reactive gas and the metal particles oxidize to form a solid oxide film on the substrate. The higher the bombardment of ion energy, the higher the density of oxide film, which increases barrier performance; however, even the dense oxide film has contains numerous voids that still allow for oxygen and humidity penetration.

Thus, depositing a metal oxide, like large marbles in a jar which could freeze upon touching, there becomes a high amount of void space for ingress of foreign gases to move through. Therefore, the vacuum deposited metal oxide, itself, is a poor environmental barrier layer, thereby requiring other layers and increased thickness to make up for its porosity. This is this why some existing processes for creating a barrier film rely on the combination of several vacuum deposited metal oxide layers and a nitride layer to provide a barrier protection, i.e., overlapping multiple layers metal oxide/nitride layers having respective porosity, bring down the over porosity of the overall layers.

Further, sputtering is an energetic deposition process that generates heat on the substrate surface, which is not compatible with depositing a film on plastic substrates as plastics require a low temperature process. Further, the high energetic nature of the sputtering forms high packing density rigid films that easily cracks on flexible substrates.

These existing process relies on a growing layers of the graded barrier film using oxygen plasma and in a controlled environment, i.e., in a reaction chamber of the sputtering device, which is a time consuming process and adds cost to the process as the environment for growing the metal oxide and metal nitride layers needs to be carefully controlled.

Further, the sealing problem is compounded for device configurations that not only require protection but also call for a transparent top layer or layers—e.g., a transmissive mode electrochromic device (ECD) formed on a transparent or opaque substrate. Also, applications of ECD require flexible plastic substrates, which in turn require a flexible barrier coating. Further, plastics are also permeable for oxygen and humidity. Therefore, when a plastic substrate is used for ECD, barrier coatings must be used on both sides of the ECD or other electronic devices.

Another common thin film deposition process is electron beam, commonly called e-beam deposition. In this technique an electron-beam is focused on a deposition material that thermally evaporates it, and vapor phase condenses on the substrate to form a solid film. The density of the film can be control by process conditions. In this technique reactive deposition is also possible by using reactive gas during process. Ion assisted e-beam deposition provides denser films. Depending on the pore size, porous films are still permeable for oxygen and humidity.

Solutions to the sealing problem is also harder to find if the device to be protected cannot withstand high processing temperatures required by some coating processes, described above. An example of this is a transmissive mode ECD formed on a polymeric substrate or supporting member.

Another existing solution relates to polymeric overcoats, such as various poly-para-xylylene coatings sold under the trade name of parylene that have been widely used for environmental protection. Although these are deposited at relatively low temperatures and provide smooth transparent coatings, they are not adequately effective against preventing long term ECD degradation both because the parylene films are somewhat permeable to water and oxygen and because they degrade when exposed to ultraviolet radiation.

Thus, the existing processes fail to provide an adequate protective coating that can be deposited on an ECD, optoelectronic, or other thin film device, at relatively low process temperatures and stress free flexible coatings.

SUMMARY OF THE INVENTION

The present invention advantageously provides a method and system for creating environmentally protective layers needed by many thin film electronic devices, such as electrochromic and optoelectronic devices.

One aspect of the invention is that it provides a method of environmentally sealing a thin film device, such as an electrochromic device, with a transparent protective coating. A preferred embodiment of this method comprises initially depositing a parylene layer on the device, subsequently vacuum depositing a composite film comprising a transparent dielectric material sandwiched between two films of a selected tenacious oxide forming material, and then exposing the coated device to air at ambient temperature. In a preferred embodiment of this structure the initial parylene film has a thickness of at least fifty nanometers but not more than fifty microns; the two layers of the tenacious oxide forming material have thicknesses of at least five nanometers but not more than five microns; and the selected dielectric material has a thickness of five nanometers to five microns.

A further aspect of the invention is that it provides a protective film that acts as a diffusion barrier between a thin film device, such as an electrochromic device, and a polymeric supporting member or substrate. The diffusion barrier is formed from a transparent inorganic dielectric material sandwiched between two films of a selected tenacious oxide forming material and is deposited either directly on the substrate, or, if the substrate surface is not adequately smooth, on a parylene coating deposited directly on the substrate. After the composite inorganic film is deposited, it is exposed to air at near ambient temperatures to oxidize the tenacious oxide forming species and thereby fill voids in the film structure. In preferred embodiments the two layers of the tenacious oxide forming material have thicknesses of at least five nanometers but not more than five microns; and the selected dielectric material has a thickness of five to five nanometers to five microns.

Yet another aspect of the invention is that it provides a composite inorganic film comprising a transparent dielectric material sandwiched between two films of a selected tenacious oxide forming material that is partially oxidized subsequent to deposition. In this arrangement the unoxidized portion of the oxide forming material (e.g., silicon) absorbs UV radiation that would otherwise damage a parylene layer covered by the composite inorganic film.

A still further aspect of the invention is that it provides a method of constructing a diffusion barrier between a thin film electronic device and a polymeric supporting member. This method involves depositing a composite inorganic film of the type discussed above on one or more polymeric supporting member(s) and then exposing the composite inorganic film to air for a selected period of time to form a diffusion barrier film. Subsequently one may deposit a thin inorganic film device on the diffusion barrier film. Alternately, one may form a protected device using a liquid electrolyte by depositing an electrode on each of two diffusion barrier films on respective polymeric supports and then sandwiching the liquid electrolyte between the electrodes.

According to one embodiment of the invention, a method of making a diffusion barrier film for a device is provided. A composite inorganic film is deposited on a substrate while the substrate is in a first environment. The first environment is a vacuum environment. The composite inorganic film includes a dielectric layer including a dielectric material and a first oxidizable layer including a first tenacious oxide forming material. The first oxidizable layer is in direct intimate contact with a first of two surfaces of the dielectric layer. The substrate having the composite inorganic film is removed from the vacuum environment. The substrate having the composite inorganic film is introduced to a second environment different from the vacuum environment. While the substrate is in the second environment, the first oxidizable layer of the composite inorganic film is exposed to a source of oxygen for a period of time to oxidize the first oxidizable layer, thereby forming a first barrier layer of the barrier film.

According to one embodiment of this aspect, the composite inorganic film further includes a second oxidizable layer that includes a second tenacious oxide forming material. The second oxidizable layer in direct intimate contact with the second of two surfaces of the dielectric layer. The second oxidizable layer oxidizes while the substrate is in the second environment, thereby forming a second barrier layer of the diffusion barrier film. According to one embodiment of this aspect, the first oxidizable layer, dielectric layer and second oxidizable layer are deposited during a single evacuation cycle while in the vacuum environment. A temperature of the single evacuation cycle remains less than 80 degrees Celsius during the cycle. According to one embodiment of this aspect, the second environment is a non-vacuum environment. During oxidation of the first oxidizable layer and second oxidizable layer, the non-vacuum environment is at approximately 21 percent oxygen and approximately 50 percent humidity, and being at approximately 22 degrees Celsius.

According to one embodiment of this aspect, the deposited first oxidizable layer has a porosity that corresponds to void spaces within the deposited first oxidizable layer. The oxidation of the first oxidizable layer while in the second environment fills the void spaces, thereby causing the first oxidizable layer to form the first barrier layer. According to one embodiment of this aspect, the oxidation of the first oxidizable layer outside the vacuum environment increases a transmittance level of the first oxidizable layer. According to one embodiment of this aspect, the diffusion-barrier film provides anti-reflective properties, the anti-reflective properties of the diffusion barrier film are due in part to an index of refraction of dielectric layer.

According to one embodiment of this aspect, the substrate includes an optoelectronic device and a smoothing layer in direct intimate contact with the electro-optic device. The composite inorganic film is deposited on the smoothing layer of the substrate. According to one embodiment of this aspect, the optoelectronic device is an organic light-emitting diode device. According to one embodiment of this aspect, prior to removing the substrate having the composite inorganic film from the vacuum environment, depositing a parylene film on the composite inorganic film in a different environment. According to one embodiment of this aspect, prior to removing the substrate having the composite inorganic film from the vacuum environment, depositing an optoelectronic device on the composite inorganic film. According to one embodiment of this aspect, the tenacious oxide forming material of the first oxidizable layer and second oxidizable layer is at least one of silicon, aluminum, chromium, nickel and titanium. The dielectric material is at least one of silica, alumina, titania, chromium oxide, silicon nitride and silicon oxynitride.

According to another embodiment of the invention, a composite device is provided. The composite device includes an optoelectronic device and a smoothing layer. The smoothing layer is deposited on the optoelectronic device while in an environment different from first and second environment. The composite device includes a composite inorganic film deposited on the smoothing layer while in a first environment. The composite inorganic film includes a dielectric layer including a dielectric material and a first oxidizable layer including a first tenacious oxide forming material. The first oxidizable layer is in direct intimate contact with a first of two surfaces of the dielectric layer. The composite inorganic film transforming into a protective layer for protecting the optoelectronic device from environmental conditions when the composite inorganic film is removed from a first environment and introduced into a second environment different from the first environment. The first environment is a vacuum environment. The second environment is an oxidizing environment that provides oxygen to the first oxidizable layer to oxidize the first oxidizable layer, thereby forming a first barrier layer of a barrier film for protecting the optoelectronic device from environmental conditions.

According to one embodiment of this aspect, the composite inorganic film further comprises a second oxidizable layer that includes a second tenacious oxide forming material. The second oxidizable layer is in direct intimate contact with the second of two surfaces of the dielectric layer. The second oxidizable layer oxidizes while the substrate is in the second environment, thereby forming a second barrier layer of the barrier film for protecting the optoelectronic device from environmental conditions. According to one embodiment of this aspect, the first oxidizable layer, dielectric layer and second oxidizable layer are deposited during a single evacuation cycle while in the vacuum environment. A temperature of the single evacuation cycle occurs remains less than 80 degrees Celsius. According to one embodiment of this aspect, the second environment is a non-vacuum environment, during oxidization of the first oxidizable layer. The non-vacuum environment is at approximately 21 percent oxygen and approximately 50 percent humidity, and being at approximately 22 degrees Celsius.

According to one embodiment of this aspect, the deposited first oxidizable layer has a porosity that corresponds to void spaces within the deposited first oxidizable layer. The oxidation of the first oxidizable layer while in the second environment filling the void spaces, thereby causing the first oxidizable layer to form the first barrier layer. According to one embodiment of this aspect, the diffusion barrier film provides anti-reflective properties. The anti-reflective properties of the diffusion barrier film are due in part to an index of refraction of dielectric layer. According to one embodiment of this aspect, the optoelectronic device is an organic light-emitting diode device.

According to another embodiment of the invention, a method of making a diffusion barrier film for an optoelectronic device is provided. A smoothing layer is deposited on the optoelectronic device while the optoelectronic device is in an environment different from the first and second environment. A composite inorganic film is deposited on the smoothing layer while the optoelectronic device is in a first environment. The first environment is a vacuum environment. The composite inorganic film includes a dielectric layer including a dielectric material and a first oxidizable layer including a first tenacious oxide forming material. The first oxidizable layer is in direct intimate contact with a first of two surfaces of the dielectric layer. The composite inorganic film further includes a second oxidizable layer including a second tenacious oxide forming material. The second oxidizable layer in direct intimate contact with the second of two surfaces of the dielectric layer. The optoelectronic device having the deposited smoothing layer and composite inorganic film is removed from the vacuum environment. The optoelectronic device having the deposited smoothing layer and composite inorganic film is introduced to a second environment different from the vacuum environment. While the optoelectronic device having the deposited smoothing layer and composite inorganic film is in the second environment, the first and second oxidizable layers of the composite inorganic film are exposed to a source of oxygen for a period of time to oxidize the first and second oxidizable layers, thereby forming first and second barrier layers of the barrier film, The deposited first and second oxidizable layers having a respective porosity that corresponds to void spaces within the respective deposited first and second oxidizable layers. The oxidation of the first and second oxidizable layers while in the second environment filling the void spaces, thereby causing the first and second oxidizable layer to form the first and second barrier layers, the second environment being a non-vacuum environment.

According to another embodiment of the invention, a method of making a diffusion barrier film is provided. A composite inorganic film is deposited on a substrate in a vacuum environment. The composite inorganic film includes a dielectric layer including a dielectric material. The dielectric layer has a thickness of one to nine thousand nanometers. The composite inorganic film includes a first oxidizable layer including a first tenacious oxide forming material. The first oxidizable layer has a thickness of at least one but not more than fifty nanometers. The first oxidizable layer is in direct intimate contact with a first of two surfaces of the dielectric layer. The composite inorganic film is removed from the vacuum environment. The first oxidizable layer of the composite inorganic film is exposed to a source of oxygen for a period of time while the composite inorganic film is outside the vacuum environment to oxidize the first oxidizable layer and form the diffusion barrier film.

According to one embodiment of this aspect, the composite inorganic film further includes a second oxidizable layer including a second tenacious oxide forming material. The second oxidizable layer in direct intimate contact with the second of two surfaces of the dielectric layer. According to one embodiment of this aspect, depositing, subsequent to exposing the composite inorganic film to a source of oxygen, a parylene film on the resultant diffusion barrier film. According to one embodiment of this aspect, depositing, prior to depositing the composite inorganic film, a parylene film having a thickness of at least 0.5 micron but not more than fifty microns on the substrate.

According to one embodiment of this aspect, depositing, subsequent to exposing the first oxidizable layer to the source of oxygen, a thin film device on the diffusion barrier film. According to one embodiment of this aspect, depositing, prior to depositing the composite inorganic film, a thin film device on the substrate. According to one embodiment of this aspect, the first tenacious oxide forming material is at least one of silicon, aluminum, chromium, nickel and titanium. According to one embodiment of this aspect, the dielectric material is at least one of silica, alumina, titania, chromium oxide, silicon nitride and silicon oxynitride. According to one embodiment of this aspect, the dielectric and oxidizable layers of the composite inorganic film are deposited sequentially and graded into each other.

According to one embodiment of this aspect, the layers of the composite inorganic film are deposited during a single evacuation of a vacuum chamber. According to one embodiment of this aspect, the period of time is determined based on a measurement of a temporal variation of transparency of the composite film. According to one embodiment of this aspect, the step of exposing the composite film to the source of oxygen is carried out at ambient temperature. According to another embodiment of the invention, a method of providing a diffusion barrier film on a polymeric substrate is provided.

A composite inorganic film is deposited on a first surface of the substrate in a vacuum environment. The composite inorganic film includes a dielectric layer comprising a dielectric material, the dielectric layer having a thickness of one to nine thousand nanometers and a first oxidizable layer includes a first tenacious oxide forming material. The first oxidizable layer has a thickness of at least one but not more than fifty nanometers. The first oxidizable layer is in direct intimate contact with a first of two surfaces of the dielectric layer. The composite inorganic film includes a second oxidizable layer comprising a second tenacious oxide forming material, the second oxidizable layer being in direct intimate contact with a second of the two surfaces of the dielectric layer. The composite inorganic film is removed from the vacuum environment. The first oxidizable layer of the composite inorganic film is exposed to a source of oxygen for a period of time while the composite inorganic film is outside the vacuum environment to oxidize the first oxidizable layer and second oxidizable layer and form the diffusion barrier film.

According to one embodiment of this aspect, depositing a thin film device on the diffusion barrier film. According to one embodiment of this aspect, depositing a thin film device on a surface of the substrate other than the surface of the substrate on which the diffusion barrier film has been deposited. According to one embodiment of this aspect, a step of depositing a parylene film on the diffusion barrier film and subsequently depositing a thin film device on the parylene film.

According to another embodiment of the invention, a method of providing a diffusion barrier film between a liquid electrolyte and a polymeric supporting member. A composite inorganic film is deposited on the polymeric supporting member in a vacuum environment. The composite inorganic film includes a dielectric layer including a dielectric material. The dielectric layer has a thickness of one to nine thousand nanometers and a first oxidizable layer includes a first tenacious oxide forming material. The first oxidizable layer has a thickness of at least one but not more than fifty nanometers. The first oxidizable layer is in direct intimate contact with a first of two surfaces of the dielectric layer. The composite inorganic film is removed from the vacuum environment. The composite inorganic film is exposed to a source of oxygen for a period of time while the composite inorganic film is removed from the vacuum environment to oxidize the first oxidizable layer and forms the diffusion barrier film. An electrode is deposited on the diffusion barrier film. The liquid electrolyte is sandwiched between the electrode on the diffusion barrier film and a second electrode supported by a second supporting member.

According to one embodiment of this aspect, the composite inorganic film further includes a second oxidizable layer comprising a second tenacious oxide forming material. The second oxidizable layer is in direct intimate contact with the second of two surfaces of the dielectric layer. According to one embodiment of this aspect, the second supporting member is a second polymeric supporting member and a second diffusion barrier film is disposed between the second supporting member and the second electrode.

Those skilled in the art will recognize that the foregoing broad summary description is not intended to list all of the features and advantages of the invention. Both the underlying ideas and the specific embodiments disclosed in the following Detailed Description may serve as a basis for alternate arrangements for carrying out the purposes of the present invention and such equivalent constructions are within the spirit and scope of the invention in its broadest form. Moreover, different embodiments of the invention may provide various combinations of the recited features and advantages of the invention, and that less than all of the recited features and advantages may be provided by some embodiments.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

As used herein, relational terms, such as "first," "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figures 1, 2:
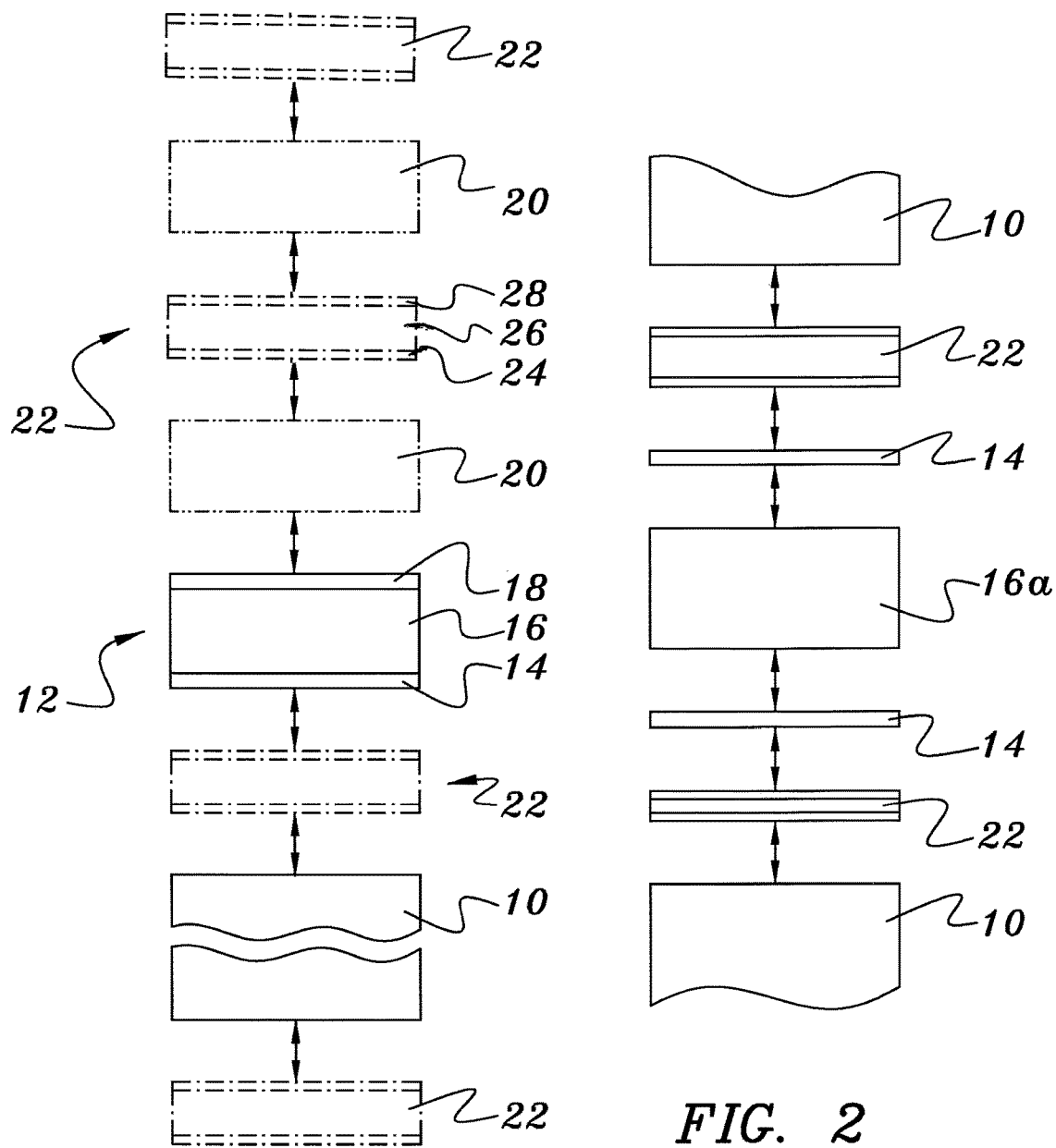
FIG. 1 is a schematic exploded view of an environmentally protected solid state thin film device, where the depicted thicknesses of various films have been selected for clarity of presentation and are not representative of actual thicknesses. Alternate positions for a diffusion barrier film and other layers are depicted by dotted phantom, i.e., dashed lines.
FIG. 2 is a schematic exploded view of a device formed by sandwiching a liquid electrolyte between two supporting members comprising composite inorganic protective layers of the invention. As with FIG. 1, the depicted thicknesses of various films have been selected for clarity of presentation and are not representative of actual thicknesses.

An exemplar environmentally protected thin film electro-optic or optoelectronic device structure is schematically depicted in the FIG. 1 as a sequence of thin films. The reader should note that the depicted thicknesses of the various films are not proportional to their actual values. Various positions for a diffusion barrier film and other layers are depicted by dotted phantom, i.e., dashed lines, in the figures.

A wide variety of materials may be used as a substrate or supporting member 10 for a thin film device 12. These include both polymeric and inorganic materials that may be transparent or opaque, depending on the device and its intended use. In embodiments in which the protected electrooptic or optoelectronic device 12 is an ECD, one often faces a requirement that the supporting member 10 be flexible, which leads to the use of polymers, such as polyethylene terephthalate (PET) or polycarbonate (PC). These materials are not compatible with elevated processing temperatures.

A wide variety of thin film devices may be considered for protection by barrier films of the invention. These include without limit: photovoltaic, organic light-emitting diode (OLED) devices, electrochromic, optoelectronic and electroluminescent devices, among other thin film devices that are known in the art that require protection from environmental conditions. These devices may comprise inorganic or organic active materials and may be formed monolithically (e.g., by sequential vapor deposition of inorganic thin films making up a preferred electrochromic device) or by other means. In one embodiment, the thin film device is an electrochromic device (ECD) and is more preferably an inorganic thin film ECD of the type taught in the inventor's U.S. Pat. No. 7,265,890 and U.S. Pat. No. 7,265,891, the disclosures of which are herein incorporated by reference.

In an exemplar case in which the protected device is an ECD of the type taught in U.S. Pat. No. 7,265,890 and U.S. Pat. No. 7,265,891, the electrode 14 may be deposited directly on a glass substrate. The substrate electrode 14 may be opaque, if the electro-optic device 12 is to be used in a reflective mode, or may be transparent, if the device is to modulate transmitted light. In one embodiment in which the protected electro-optic device is a thin film ECD the substrate electrode may be a transparent conductive oxide (TCO).

Other layers of thin film device 12 may be sequentially deposited on the substrate electrode 14. A transparent top electrode 18 is then provided on the thin film device. In one embodiment, the transparent top electrode 18 is a composite film taught by the inventor in U.S. Pat. No. 7,531,239, the disclosure of which is herein incorporated by reference.

The reader should recognize that although laterally uniform electrodes are described in the embodiments, either or both of the electrodes 14, 18 may be spatially non-uniform. In some cases these electrodes may be in the form of a metal comb or grid array.

A topologically smoothing layer 20 may be deposited over the thin film device 12. This may be one of various polymers comprising polyamides, aromatic ethers, or poly-para-xylylene coatings sold under the trade name of parylene and applied either as a spin-on coating or by chemical vapor deposition. This layer may be either a Type C or a Type F parylene, depending on the spectral range of operation of the protected device. In one embodiment, parylene deposition films were deposited at a substrate temperature of 100-120° C. in a vacuum of about one miliiTorr. The selected thickness of the parylene film depends on the topology of the underlying thin film device and is chosen to be thick enough to cover whatever surface asperities or pinholes are associated with the device in question. If the surface to be protected is adequately smooth the sealing and topologically smoothing, e.g., parylene, layer can be omitted. More commonly a parylene coating of roughly 500 to 2000 nm is used. In some cases the parylene coating can have a thickness of 50 microns.

A composite inorganic film 22 of the invention may be deposited over topologically smoothing layer 20, which may improve environmental protection of an underlying device. The deposition method used for depositing composite inorganic film 22 may be a low energetic (electron beam) e-beam process, thereby creating a substantially stress free coating. Substrate temperature is a measure of accumulated heat/energy during deposition such that, in one example of the low energetic process described herein, 1 micron thick e-beam deposited coating generates less than an 80 degree Celsius temperatures, e.g., is a low energetic process. In one embodiment, the maximum temperature does not exceed 80 degrees Celsius during deposition of ECD 12 and does not exceed 60 degrees Celsius for deposition of composite inorganic film 22. The preferred composite inorganic film 22 comprises three sequentially deposited layers; first oxidizable layer 24, dielectric layer 26, and second oxidizable layer 28 that may be graded into each other during deposition and that appear to approach a homogeneous consistency during a post-deposition oxidation step.

A first oxidizable layer 24 is preferably formed by vacuum deposition of one to fifty nanometers of a material known to form a tenacious surface oxide. Such materials comprise, but are not limited to, silicon, aluminum, chromium, nickel, titanium and alloys of these materials. In a preferred process the deposition is carried out by a physical vapor deposition technique with electron beam evaporation being most preferred. In preferred arrangements deposition is onto an inorganic thin film ECD 12 that is maintained near ambient temperature.

A dielectric layer 26 of the sequentially deposited films, is preferably formed by vacuum deposition of one to nine hundred nanometers of a selected dielectric material compatible with the material of the first oxidizable layer 24. The selected dielectric may comprise, without limitation, silica, alumina, titania, chromium oxide, tantalum pentoxide; a variety of nitrides, such as aluminum nitride and silicon nitride; various oxynitrides such as those of aluminum and silicon, and numerous fluorides such as those formed with aluminum, yttrium, and lithium. These dielectrics may be used with the material from which the oxide is formed (e.g., Si $SiO_2$) or may be used with other oxide formers.

In particular, dielectric layer 26 provides flexibility to composite inorganic film 22. In one embodiment, for optical purposes, dielectric layer 26 is selected from low (L) refractive index (n approximately 1.5) materials, such as $SiO_2$ and LiF, intermediate/medium (M) index (n approximately 1.7) materials, like $Al_2O_3$, $Y_2O_3$, AlN, and $Si_3N_4$, or high (H) index (n approximately 2 or higher) materials, like $TiO_2$, $Ta_2O_5$, and CrOx. The optical properties of the L, M and/or H index materials provide anti-reflective, (AR) performance for composite inorganic film 22. An example of composite inorganic layer 22 with a total thickness of 90 nm, wherein the combined thickness of the first and second oxidizable layers (24, 26) is 10 nm and the dielectric layer ($SiO_2$) 28 is 80 nm, provides both barrier and AR properties to ECD 12.

In one embodiment, smoothing layer 20 is 0.5 micron parylene C deposited on ECD 12. Deposition occurs by heating the dimer in the 2.2 Pascal vacuum environments till deposition material completely evaporates. The 1 g dimer at evaporator temperature of 135 degrees Celsius makes 0.5 micron parylene film. Deposition time is approximately 75 minutes. Then, the parylene coated ECD 12 is taken from the parylene coater and transferred to an electron beam (e-beam) coater. In the electron beam coater, the composite inorganic film 22 which is made up of the three sequentially deposited films 24, 26 and 28 is deposited in one pump down process onto a reference bare glass sample and on ECD 12 coated with topological smoothing layer 20 made of parylene. In one embodiment, first oxidizable layer 24 is a 3 nm thick Si film deposited at 2×E-6 Torr background pressure with a deposition rate of 0.05 nm/sec from e-beam heated Si source, then dielectric layer 26 is 100 nm thick $SiO_2$ is deposited at 2×E-6 Torr background pressure with disposition rate of 0.3 nm/sec from e-beam heated $SiO_2$ source. Then second oxidizable layer 28 is 7 nm thick Si film is deposited at 2×E-6 Torr background pressure with a deposition rate of 0.05 nm/sec from e-beam heated Si source.

ECD 12 coated with topological smoothing layer 20 of parylene further coated with composite inorganic film 22 and along with glass reference samples coated with only composite inorganic film 22 are then taken out of from the vacuum environment to lab conditions. In one embodiment, lab conditions includes atmospheric pressure of air around 1000 mili bar, approximately 21% oxygen, approximately 50% humidity and approximate 22 degrees Celsius, i.e., the atmospheric pressure of Earth at sea level. The composite inorganic film 22 will initially have a light brownish color. This color may vary depending on the total Si thickness of composite inorganic layer 22. For example, the thick the Si film, the darker the coating.

The air ageing of the composite inorganic film 22 in the lab conditions may be evaluated by measuring time dependent spectral transmission. In one embodiment, the sample shows UV side absorption with lower transmission which corresponds to the existence of Si film (energy gap of Si is 1.1 ev). UV side transmission increases by increasing air ageing time which corresponds to $SiO_2$ film formation. For example, in one day of air aging, the samples of composite inorganic film 22 coated on ECD 12 reached saturated transmission levels with a slight level of UV absorption, i.e., the samples went from a brownish color to a pale yellow color. This residual absorption indicates that the 10 nm Si is not completely oxidized to $SiO_2$.

Figure 3:
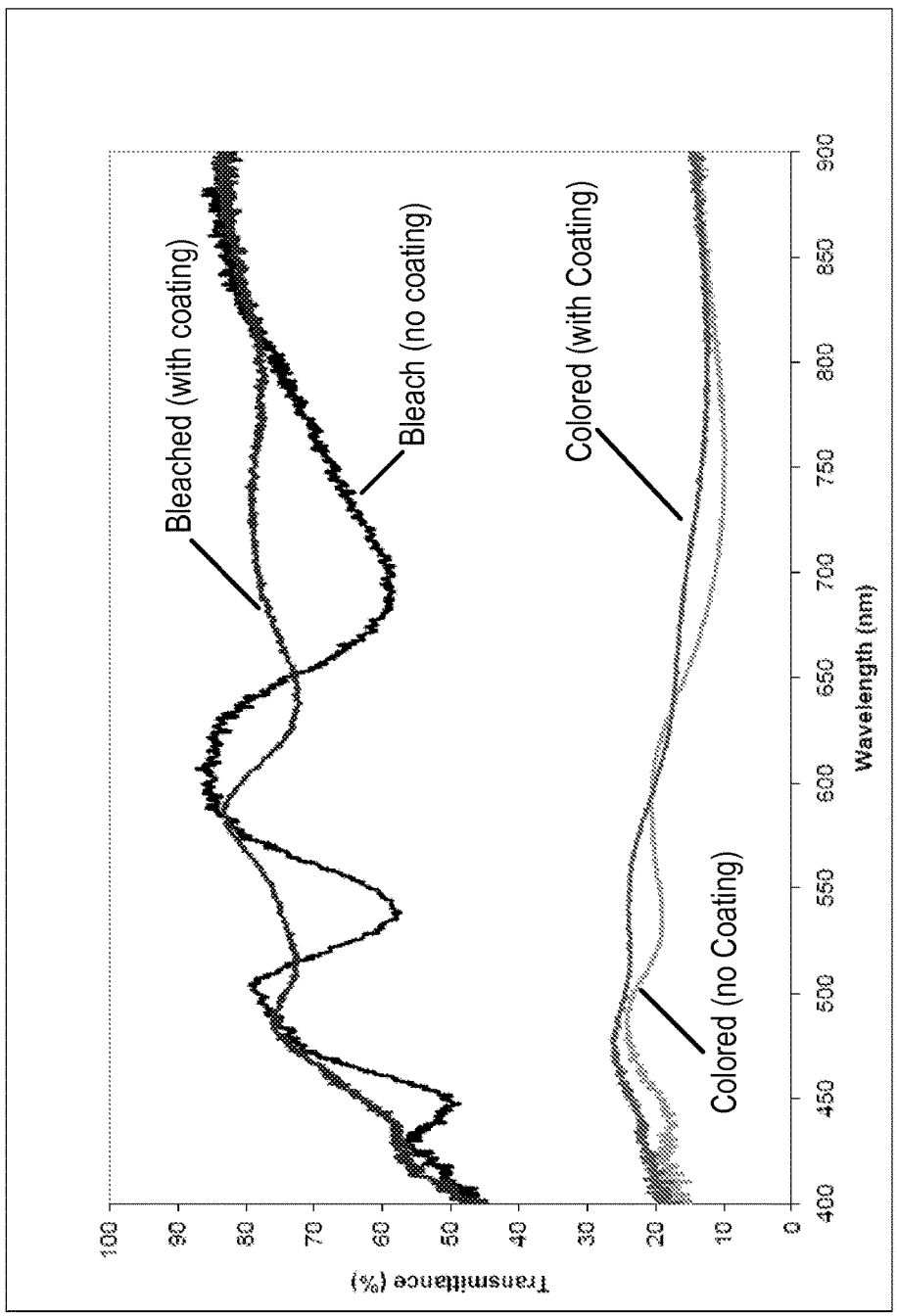
FIG. 3 illustrates a graph of the performance of an ECD with and without the barrier film coating in accordance with the principles of the invention.
Figure 4:
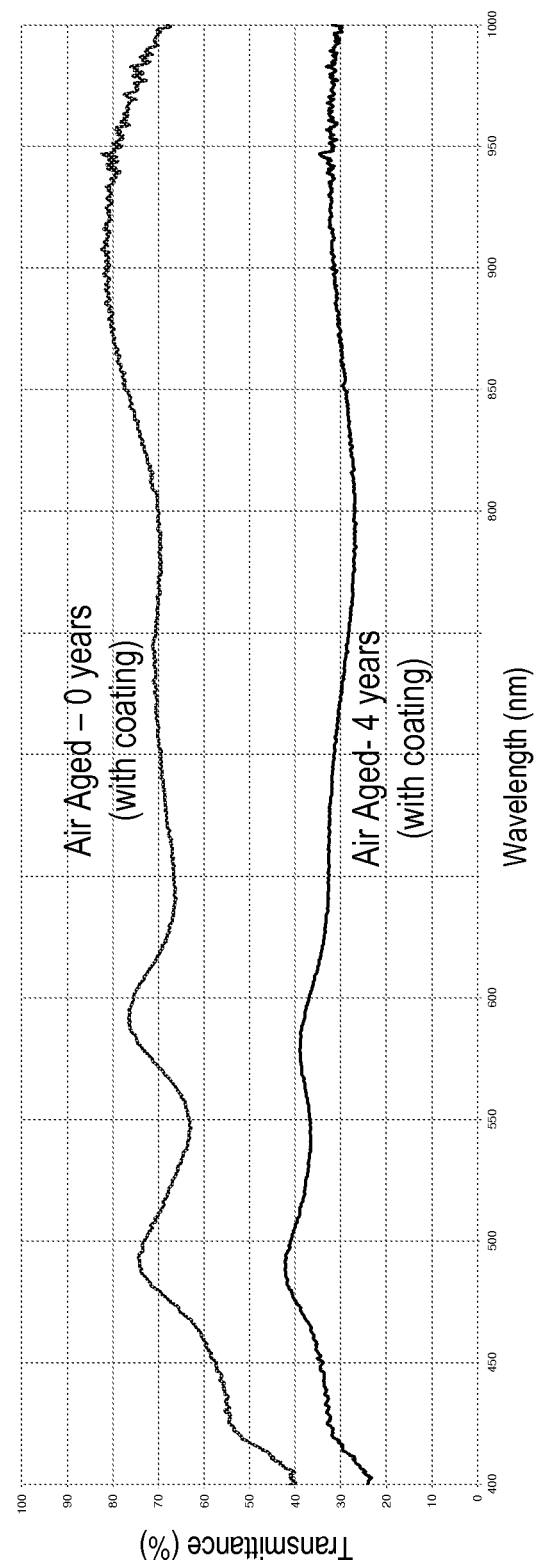
FIG. 4 is a graph illustrating electrochromic activity of the barrier film coating with AR properties after four years of air aging in accordance with the principles of the invention.

In one embodiment, the thickness of first oxidizable layer 24, i.e., the first Si layer, is reduced to 2 nm. In this case, air aging for one day completely cleared up composite inorganic film 22, i.e., went from a light brownish color to clear, corresponding to the 2 nm layer of Si being oxidized to $SiO_2$. Air aging of a bare ECD was compared with a composite inorganic film 22 and topological smoothing layer 20 coated ECD 12. The bare ECD shows fast degradation which is around one to six months, but an ECD 12 coated with topological smoothing layer 20 of parylene further coated with composite inorganic layer 22 shows a one to four year life time. Referring to FIG. 3, there is shown colored and bleached spectral performances of a device with and without a composite inorganic layer 22 having AR properties. After oxidation of the Si in first and third deposited films 24 and 28 (air aged) total thickness of composite inorganic layer 22, in this example is 90 nm. Composite inorganic layer 22 with AR properties smooth out the spectral transmittance plots of the sample observed on both colored and bleached cases (FIG. 3). Electrochromic activity of the composite inorganic layer 22 with AR properties after four years of air aging is shown in FIG. 4. Air ageing affects the switching speed of ECD by slowing down the switching speed.

The first oxidizable layer 24 and second oxidizable layer 28 is preferably formed by vacuum deposition of five to fifty nanometers of a material known to form a tenacious surface oxide. The materials of the first oxidizable layer 24 and second oxidizable layer 28 may be the same, or may differ.

The three sequentially deposited films 24, 26, 28 are all deposited during a single evacuation cycle of a vacuum deposition chamber. These films may be separately deposited, i.e., wherein the deposition of one film is stopped before the deposition of the next film begins, or the films may be graded into each other, e.g., by beginning the deposition of a material before completing deposition of its predecessor.

After deposition of the composite inorganic film 22 is complete, the coated devices are removed from the vacuum deposition chamber and exposed to ambient air, i.e., a second environment, for a selected period of time, which may be a matter of seconds or hours or longer. During this period oxygen can diffuse into the protective film and react with the tenacious oxide forming species to self seal the coating. In one embodiment, second environment is a non-vacuum at approximately 21 percent oxygen and approximately 50 percent humidity, and being at approximately 22 degrees Celsius and approximately 1000 milibars. Using the Si deposited film example, Si is deposited in a specific porosity and rate that creates void spaces in the deposited Si layer. Since Si is a denser material, these void spaces are generally smaller. However, once "stuck" in place, the Si is still reactive with $O_2$ (where vacuum deposited $SiO_2$ is not). Therefore, removing the Si deposited film from the vacuum chamber and moving it to an ambient or second environment, causes foreign $O_2$ molecules to slide through the deposited Si layer. The Si bonds with $O_2$ module, thereby blocking the void space channels, like a ball blocking a pipe. Put simply, vacuum deposited metal oxides, e.g., $SiO_2$, will not provide adequate barrier layer protection due to their inherent porosity, while the process described herein, i.e., Si disposition with oxidation in a non-vacuum environment, provides a metal oxide layer that, itself, provides barrier layer protection. Further, the process described herein can be carried out at low temperatures and provides minimum stress to the device being coated. Further, the metal oxide layers can be thin while still being able to provide barrier layer functionality. During the oxidation stage of the process, the transparency of the coating increases progressively as the oxide-former is consumed and ultimately saturates, thereby allowing for a visually observable indication that the barrier layer is being formed, i.e., sealing is occurring.

When appropriate materials and thickness selections have been made for the sequentially deposited films, the oxidation process can lead to a dense, impervious film that effectively protects the protected electronic device. Moreover, the oxidation process can be monitored by observing or measuring the transparency of the inorganic protective layer. For example, after depositing Si on a substrate, the substrate is taken out of the vacuum chamber and introduced to air or an ambient or second environment where the Si surface oxidizes until a protective oxide is formed. The initially deposited Si film/layer may have a brownish-yellow color and may be opaque. As the Si film oxidizes, in the ambient environment, to form $SiO_2$, the transparency increases.

The choice of appropriate materials and layer thicknesses results in a solid protective film that is highly transparent, as well as being an effective sealant. The thickness of the deposited Si film/layer may be selected based at least in part on the desired transmittance of the composite inorganic film 22. For example, increasing $SiO_2$ thickness and reducing Si thickness leads to increased transmittance of the composite inorganic film 22.

In other words, the instant invention advantageously reduces the complexity and cost in creating the inorganic protective layer by performing the oxidizing/sealing step outside the vacuum in an environment, i.e., second environment or non-vacuum environment where the temperature and humidity may fluctuate or be uncontrolled.

It may be noted that the thickness of the oxide forming layers may be selected so that a non-oxidized fraction remains even after an effective diffusion barrier has been formed. This can provide a spectrally selective absorbing coating that protects a parylene coating disposed between the composite inorganic film 22 and the thin film device 12. An example of this is an infra-red ECD having a parylene initial overcoat and an inorganic overcoat of Si—$SiO_2$—Si in which residual Si in the overcoat absorbs incident UV.

The oxidized composite inorganic film 22 structure provides an effective diffusion barrier that is very thin and flexible. Because of its thinness, the composite inorganic film 22 is easily damaged. Thus, it is often desirable to add one or more additional parylene coatings 20 over the initial composite inorganic film. If more than one additional parylene coating 20 is used, they may be interspersed or overcoated with additional composite inorganic films 22.

Although the foregoing discussion has been directed at protecting an exposed surface of a thin film device with a composite inorganic film (diffusion barrier) 22, the reader should note that the composite inorganic protective film 22 may also be placed between a substrate or other supporting member and the associated thin film device 12. This is of particular value when the thin film device 12 is deposited on a flexible polymeric substrate such as PET or polycarbonate, both of which are somewhat permeable to oxygen and water. In these cases the composite inorganic film 22 is deposited either directly on the substrate 10 or, if the substrate 10 is not adequately smooth, on a parylene layer on the substrate 10. After the composite film 22 is aged and stabilized, or if the thicknesses of the layers are selected for fast stabilization, the thin film device is formed on the composite inorganic film 22. The multi-layer overcoat of parylene and the composite inorganic film 22 can be used to seal the device, as described above.

The composite inorganic film 22 of the invention may also be used to provide environmental protection to devices formed between two supporting members. Turning to FIG. 2, one finds an exemplar device formed by introducing an (electrochromic device) ECD 16a comprising a liquid, or gel, or polymer sheet electrolyte sandwiched between electrodes on two supporting members 10. A composite inorganic film 22 of the invention may be deposited on the supporting members 10, which are then aged in air to form an effective diffusion barrier film 22. Electrodes 14 are subsequently deposited on the supporting members 10 coated with diffusion barrier film 22. The gel or liquid active material is then introduced between the electrodes 14 using known approaches.

Example 1

Thin-film ECDs of the sort disclosed by the inventor in U.S. Pat. No. 7,265,891 were formed on glass substrates. Some of these devices were coated with a 0.5 micron parylene C film. A silicon-silicon dioxide-silicon composite inorganic film was deposited by e-beam evaporation on some of the parylene coated devices. In these composite inorganic films, the initial silicon layer was 2-4 nm thick; the $SiO_2$ layer was 10 to 300 nm thick, deposited at 0.5 to 1 nm/sec; and the top Si film was 2-50 nm thick.

The uncoated ECDs survived a short time, i.e., about a week, under ambient lab conditions including 21 percent oxygen and approximately 50 percent humidity, and being at approximately 22 degrees Celsius and approximately 1000 mbars. The parylene coated ECDs that did not have the composite inorganic film overcoat survived about two to three weeks in an air-conditioned laboratory, i.e., lab conditions listed above. The ECDs that received parylene and three layers of $SiO_2$ survived roughly the same time as the parylene coated ECDs. The ECDs that received both the parylene and composite inorganic film coatings of Si—$SiO_2$—Si and a subsequent air exposure have a projected lifetime of years based on their having survived several months in ambient lab conditions described above.

Example 2

The experiment shows that air oxidized $SiO_2$ formed on Si surface provides good barrier coating properties. Sample devices were prepared using the method described in Example One, but with thicker Si layers. In this experiment the Si layers of composite inorganic film 22 were 3 nm (layer 24) to 15 nm (layer 28) thick. After ambient oxidation of a few minutes the transmissivity of these films was 59% at a wavelength of 500 nm. This transmissivity rose to only about 63% after a month of air exposure. The films described in Example One, on the other hand had an initial transmissivity of about 84%, which rose to and saturated at 88% over a period of 5 hours. The transmissivity of the films with the thicker Si layer was about 10% at 400 nm. Thus, the residual unoxidized silicon in the composite inorganic film 22 effectively blocks ultraviolet light from reaching and degrading the underlying parylene film.

Example 3

Thin-film ECDs of the sort disclosed by the inventor in U.S. Pat. No. 7,265,891 were formed on glass substrates. Half of each device was coated with an anti-reflective composite inorganic film 22 consisting of 2 nm Si (layer 24), 80 nm $SiO_2$ (layer 26) and 8 nm Si (layer 28). No parylene film was used. The devices were exposed to ambient air, i.e., lab conditions including 21 percent oxygen and approximately 50 percent humidity, and being at approximately 22 degrees Celsius and approximately 1000 milibars, and repeatedly cycled between colored and bleached states. The non-coated portion of the device samples showed visible degradation after 5000 cycles. The coated portion of the device samples were not degraded by the end of the 250,000 cycle test.

Although the present invention has been described with respect to several preferred embodiments, many modifications and alterations can be made without departing from the invention. Accordingly, it is intended that all such modifications and alterations be considered as being within the spirit and scope of the invention as defined in the attached claims.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method of making a diffusion barrier film for a device, the method comprising:
   depositing, via electron beam evaporation, a composite inorganic film on a substrate while the substrate is in a first environment, wherein
      the first environment is a vacuum environment;
      a temperature of the first environment remains below 80 degrees Celsius during the depositing via electron beam evaporation; and
      the composite inorganic film includes:
         a dielectric layer including a dielectric material;
         a first oxidizable layer including a first tenacious oxide forming material, the first oxidizable layer being in direct intimate contact with a first of two surfaces of the dielectric layer; and
         a second oxidizable layer including a second tenacious oxide forming material, the second oxidizable layer being in direct intimate contact with a second of two surfaces of the dielectric layer;
   removing the substrate having the composite inorganic film deposited thereon from the vacuum environment;
   introducing the substrate having the composite inorganic film deposited thereon to a second environment different from the vacuum environment; and
   exposing, while the substrate having the composite inorganic film deposited thereon is in the second environment, the first oxidizable layer and the second oxidizable layer of the composite inorganic film to a source of oxygen for a period of time to respectively oxidize the first oxidizable layer and the second oxidizable layer, thereby respectively forming a first barrier layer and a second barrier layer of the diffusion barrier film.

2. The method of claim 1, wherein the first oxidizable layer, dielectric layer, and second oxidizable layer are deposited during a single evacuation cycle while in the vacuum environment.

3. The method of claim 1, wherein the second environment is a non-vacuum environment, the non-vacuum environment being at approximately 21 percent oxygen, approximately 50 percent humidity, and approximately 22 degrees Celsius.

4. The method of claim 1, wherein the first oxidizable layer, once deposited via electron beam evaporation, has a porosity that corresponds to void spaces within the first oxidizable layer; and
   the oxidation of the first oxidizable layer while in the second environment fills the void spaces, thereby causing the first oxidizable layer to form the first barrier layer.

5. The method of claim 1, wherein the oxidation of the first oxidizable layer outside the vacuum environment increases a transmittance level of the first oxidizable layer.

6. The method of claim 1, wherein the diffusion barrier film provides anti-reflective properties, the anti-reflective properties of the diffusion barrier film being due in part to an index of refraction of the dielectric layer.

7. The method of claim 1, wherein the substrate includes:
   an optoelectronic device; and
   a smoothing layer, the smoothing layer being in direct intimate contact with the optoelectronic device and having the composite inorganic film deposited thereon.

8. The method of claim 7, wherein the optoelectronic device is an organic light-emitting diode device.

9. The method of claim 1, further comprising, prior to removing the substrate having the composite inorganic film from the vacuum environment, depositing a parylene film on the composite inorganic film.

10. The method of claim 1, further comprising, prior to removing the substrate having the composite inorganic film from the vacuum environment, depositing an optoelectronic device on the composite inorganic film.

11. The method of claim 1, wherein the first tenacious oxide forming material is at least one of silicon, aluminum, chromium, nickel, and titanium; and
   the dielectric material is at least one of alumina, titania, chromium oxide, silicon nitride, silicon dioxide, and silicon oxynitride.

12. A method of making a diffusion barrier film for an optoelectronic device, the method comprising:
   depositing a smoothing layer on the optoelectronic device while the optoelectronic device is in an environment different from a first environment and a second environment;
   depositing, via electron beam evaporation, a composite inorganic film on the smoothing layer while the optoelectronic device is in the first environment, wherein
      the first environment is a vacuum environment;
      a temperature of the first environment remains below 80 degrees Celsius during the depositing via electron beam evaporation; and
      the composite inorganic film includes:
         a dielectric layer including a dielectric material;
         a first oxidizable layer including a first tenacious oxide forming material, the first oxidizable layer being in direct intimate contact with a first of two surfaces of the dielectric layer and having a porosity that corresponds to void spaces therein; and
         a second oxidizable layer including a second tenacious oxide forming material, the second oxidizable layer being in direct intimate contact with a second of two surfaces of the dielectric layer and having a porosity that corresponds to void spaces therein;
   removing the optoelectronic device having the smoothing layer and the composite inorganic film deposited thereon from the vacuum environment;
   introducing the optoelectronic device having the smoothing layer and the composite inorganic film deposited thereon to the second environment, the second environment being a non-vacuum environment that is different from the vacuum environment; and
   exposing, while the optoelectronic device having the smoothing layer and the composite inorganic film deposited thereon is in the second environment, the first and second oxidizable layers of the composite inorganic film to a source of oxygen for a period of time to oxidize the first and second oxidizable layers, wherein said oxidation of the first and second oxidizable layers fills the respective void spaces of the first and second oxidizable layers, thereby causing the first and second oxidizable layers to form first and second barrier layers of the diffusion barrier film.

* * * * *